United States Patent
Park et al.

(10) Patent No.: US 12,295,268 B2
(45) Date of Patent: May 6, 2025

(54) MAGNETIC MEMORY DEVICE

(71) Applicant: Samsung Electronics Co., Ltd., Suwon-si (KR)

(72) Inventors: Byongguk Park, Daejeon (KR); Jeong-Heon Park, Hwaseong-si (KR); Kyung-Jin Lee, Daejeon (KR); Jeongchun Ryu, Daejeon (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 311 days.

(21) Appl. No.: 17/723,845

(22) Filed: Apr. 19, 2022

(65) Prior Publication Data
US 2023/0040502 A1  Feb. 9, 2023

(30) Foreign Application Priority Data
Aug. 5, 2021  (KR) ........................ 10-2021-0103321

(51) Int. Cl.
| | | |
|---|---|---|
| *H01F 10/32* | (2006.01) | |
| *G11C 11/16* | (2006.01) | |
| *H10B 61/00* | (2023.01) | |
| *H10N 52/00* | (2023.01) | |
| *H10N 52/80* | (2023.01) | |
| *H10N 52/01* | (2023.01) | |

(52) U.S. Cl.
CPC ........... *H10N 52/80* (2023.02); *G11C 11/161* (2013.01); *H01F 10/3254* (2013.01); *H01F 10/3286* (2013.01); *H01F 10/329* (2013.01); *H10B 61/22* (2023.02); *H10N 52/00* (2023.02); *H10N 52/01* (2023.02)

(58) Field of Classification Search
CPC ........ H10N 52/80; H10N 52/00; H10N 52/01; H10N 50/10; G11C 11/161; G11C 11/1675; G11C 11/18; G11C 19/0841; H01F 10/3254; H01F 10/3286; H01F 10/329; H01F 10/123; H10B 61/22; H10B 61/00
See application file for complete search history.

(56) References Cited

U.S. PATENT DOCUMENTS

| | | |
|---|---|---|
| 9,343,658 B2 | 5/2016 | Wang et al. |
| 9,691,458 B2 | 6/2017 | Ralph et al. |
| 9,830,966 B2 | 11/2017 | Mihajlovic et al. |
| 9,953,692 B1 | 4/2018 | Mihajlovic et al. |
| 10,020,039 B2 | 7/2018 | Fukami et al. |
| 10,229,723 B1 | 3/2019 | Choi et al. |

(Continued)

FOREIGN PATENT DOCUMENTS

| | | |
|---|---|---|
| KR | 10-2020-0054389 A | 5/2020 |
| KR | 10-2020-0058655 A | 5/2020 |

*Primary Examiner* — Elias Ullah
(74) *Attorney, Agent, or Firm* — Harness, Dickey & Pierce, P.L.C.

(57) ABSTRACT

A magnetic memory device includes a conductive line extending in a first direction, a magnetic tunnel junction structure on a first surface of the conductive line, the magnetic tunnel junction structure comprising at least two magnetic patterns and a barrier pattern between the at least two magnetic patterns, and a magnetic layer on a second surface of the conductive line, which is opposite to the first surface. The magnetic layer includes magnetization components having a magnetization in a direction which is parallel to the second surface and intersects the first direction.

20 Claims, 11 Drawing Sheets

(56) References Cited

U.S. PATENT DOCUMENTS

| | | |
|---|---|---|
| 10,490,731 B2 | 11/2019 | Sasaki et al. |
| 10,553,790 B1 | 2/2020 | Lee et al. |
| 10,930,702 B2 | 2/2021 | Lee |
| 2017/0338403 A1* | 11/2017 | Kim ...................... H10N 50/01 |

* cited by examiner

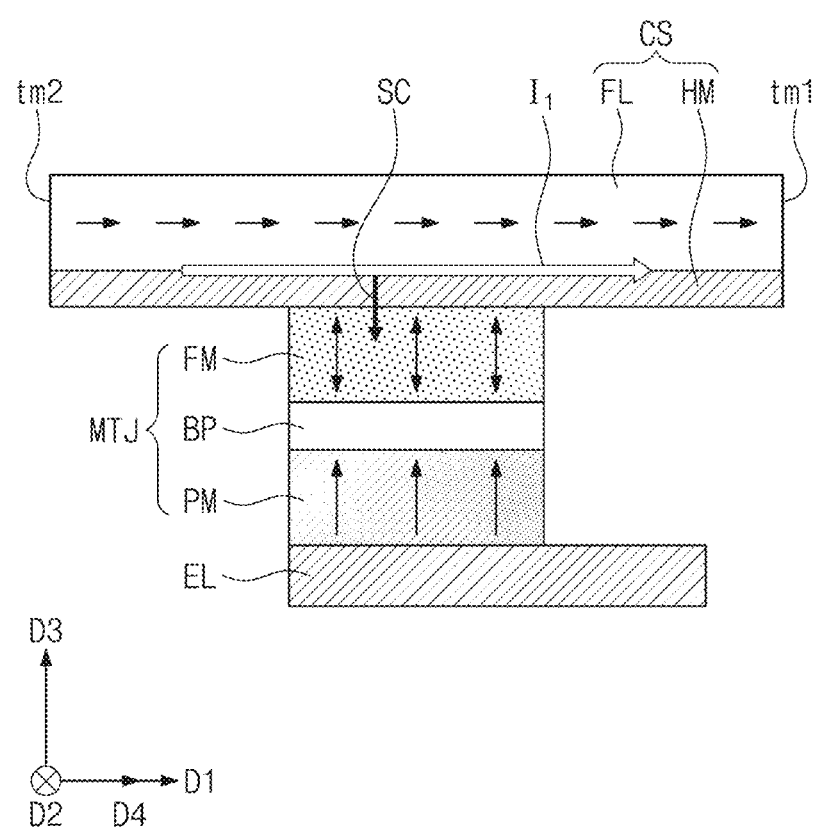

MAGNETIC MEMORY DEVICE

CROSS-REFERENCE TO RELATED APPLICATIONS

This U.S. non-provisional patent application claims priority under 35 U.S.C. § 119 to Korean Patent Application No. 10-2021-0103321, filed on Aug. 5, 2021, in the Korean Intellectual Property Office, the entire contents of which are hereby incorporated by reference.

BACKGROUND

Some example embodiments relate to a semiconductor device, and more particularly, to a magnetic memory device including a magnetic tunnel junction.

As high-speed and/or low power consumption electronic devices have been demanded, high-speed and/or low-voltage memory devices used therein have also been demanded. Magnetic memory devices have been studied as memory devices capable of satisfying these demands A magnetic memory device may include a magnetic tunnel junction (MTJ). The magnetic tunnel junction may include two magnetic layers, and a resistance value of the magnetic tunnel junction may be changed depending on magnetization directions of the two magnetic layers. The magnetic memory device may write data by controlling the magnetization direction of one of the two magnetic layers and may read data by sensing the resistance value of the magnetic tunnel junction.

SUMMARY

Various example embodiments may provide a magnetic memory device capable of reducing a critical current for changing a magnetization direction of a free magnetic pattern.

According to some example embodiments, a magnetic memory device may include a conductive line extending in a first direction, a magnetic tunnel junction structure on a first surface of the conductive line, the magnetic tunnel junction structure comprising at least two magnetic patterns and a barrier pattern between the at least two magnetic patterns, and a magnetic layer on a second surface of the conductive line, which is opposite to the first surface. The magnetic layer may include magnetization components having a magnetization in a direction which is parallel to the second surface and intersects the first direction.

According to some example embodiments, a magnetic memory device may include a conductive line extending in a first direction, the conductive line having a first surface and a second surface opposite to the first surface, a pinned magnetic pattern on the first surface, a free magnetic pattern between the conductive line and the pinned magnetic pattern, a barrier pattern between the free magnetic pattern and the pinned magnetic pattern, and a magnetic layer extending in the first direction on the second surface. The magnetic layer may have a resistivity less than that of the conductive line.

According to some example embodiments, a magnetic memory device may include a conductive line extending in a first direction, a plurality of magnetic tunnel junction structures arranged in the first direction on a first surface of the conductive line, wherein each of the plurality of magnetic tunnel junction structures comprises at least two magnetic patterns and a barrier pattern between the at least two magnetic patterns; and a magnetic layer on a second surface of the conductive line, which is opposite to the first surface. The magnetic layer may vertically overlap with the plurality of magnetic tunnel junction structures.

BRIEF DESCRIPTION OF THE DRAWINGS

Some example embodiments will be more clearly understood from the following brief description taken in conjunction with the accompanying drawings. The accompanying drawings represent non-limiting, example embodiments as described herein.

FIGS. 3A and 3C are cross-sectional views illustrating a method of operating a magnetic memory device according to some example embodiments of inventive concepts.

DETAILED DESCRIPTION

Various example embodiments of inventive concepts will now be described more fully with reference to the accompanying drawings.

Figure 1:
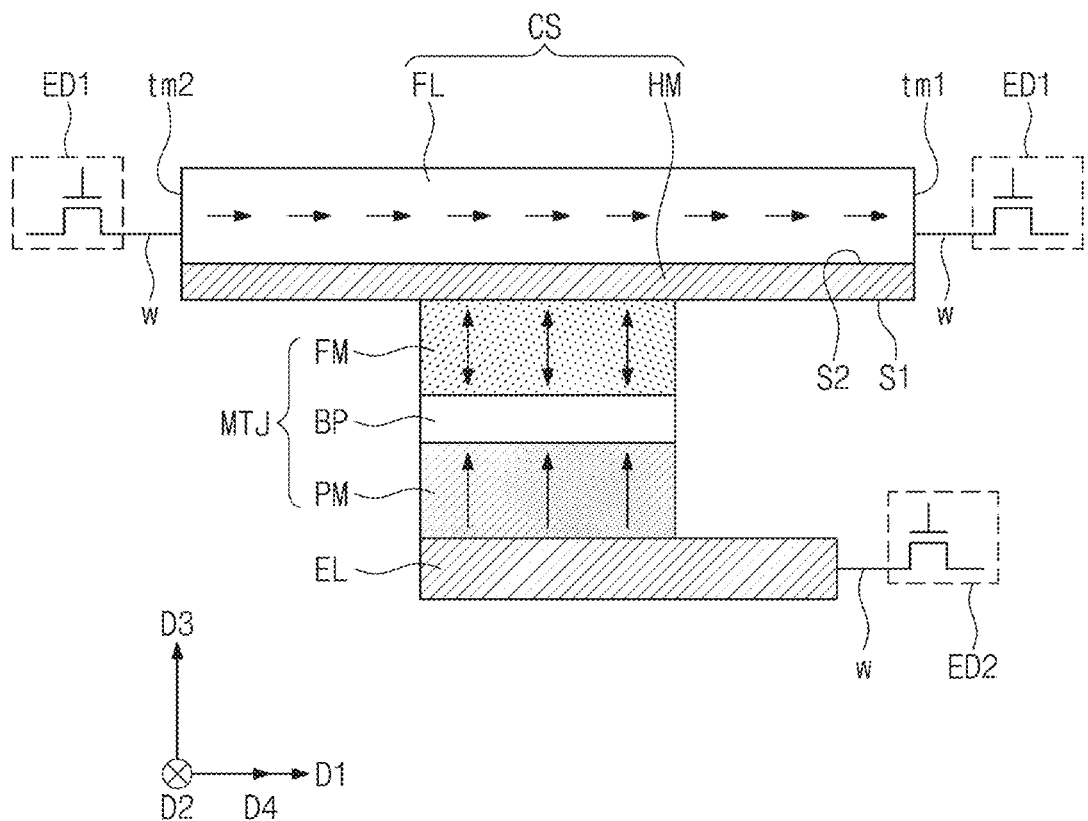
FIG. 1 is a cross-sectional view illustrating a magnetic memory device according to some example embodiments of inventive concepts.
Figure 2:
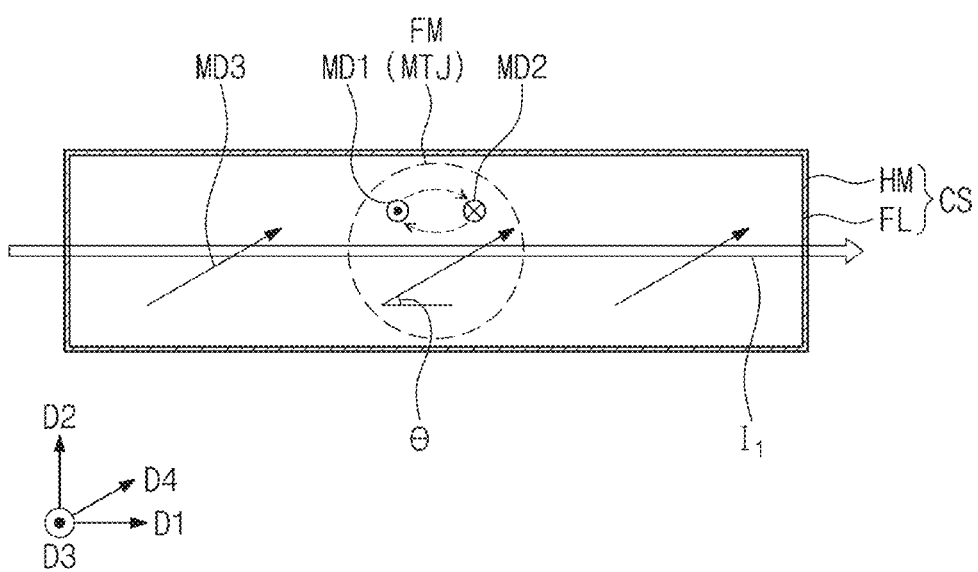
FIG. 2 is a plan view illustrating a magnetic memory device according to some example embodiments of inventive concepts.

FIG. 1 is a cross-sectional view illustrating a magnetic memory device according to some example embodiments of inventive concepts. FIG. 2 is a plan view illustrating a magnetic memory device according to some example embodiments of inventive concepts.

Referring to FIGS. 1 and 2, a magnetic memory device according to some example embodiments of inventive concepts may include an electrode EL, a magnetic tunnel junction structure MTJ, a conductive structure CS, and electronic elements ED1 and ED2. The conductive structure CS may include a conductive line HM and a magnetic layer FL. The magnetic tunnel junction structure MTJ may include magnetic patterns FM and PM between the conductive line HM and the electrode EL, and a barrier pattern BP between the magnetic patterns FM and PM.

According to some example embodiments, the magnetic memory device may include a unit memory cell which is configured to write data by controlling a magnetization direction in the magnetic tunnel junction structure MTJ and to read written data by sensing a resistance of the magnetic tunnel junction structure MTJ. The conductive structure CS may control a magnetization direction of one of the magnetic patterns FM and PM by a current flowing through the conductive structure CS and/or one of the magnetic patterns FM and PM. The magnetic tunnel junction structure MTJ may have a resistance that is changeable according to the magnetization directions of the magnetic patterns FM and PM. The resistance of the magnetic tunnel junction structure MTJ may be detected using a current flowing between the electrode EL and the conductive structure CS.

According to some example embodiments, the magnetic memory device may include a unit memory cell of a spin-orbit torque (SOT) MRAM. An in-plane current may flow in the conductive structure CS. For example, the conductive line HM and the magnetic layer FL may be configured to provide a path of the in-plane current. The in-plane current may mean or correspond to a current having a path in a direction parallel to a specific surface of a corresponding component. The in-plane current may control the magnetization direction of the magnetic pattern FM, adjacent to the conductive structure CS, of the magnetic patterns FM and PM of the magnetic tunnel junction structure MTJ.

More particularly, the conductive structure CS may be configured to provide a current path parallel to a first direction D1. The conductive structure CS may have first and second ends tm1 and tm2, and the first and second ends tm1 and tm2 may be connected to first electronic elements ED1 through interconnection lines w, respectively. The conductive structure CS may have a two-terminal structure. For example, the conductive structure CS may be connected to two interconnection lines w spaced apart from each other. For example, the interconnection lines w may include conductive layers patterned to horizontally connect components of an electronic circuit, and/or contact plugs vertically connecting components disposed at different levels. According to some example embodiments, ends of the two interconnection lines w connected to the conductive structure CS may be spaced apart from each other in the first direction D1. The conductive structure CS may extend in the first direction D1 to connect the ends of the two interconnection lines w.

According to some example embodiments, the first electronic elements ED1 may be connected to an external element of a closed circuit (not shown). The external element may apply a first current $I_1$ flowing in the first direction D1 in the conductive structure CS. The first electronic elements ED1 may include selection elements for controlling the first current $I_1$. The selection elements may be configured to turn on or off the first current $I_1$. Each of the selection elements may include at least one of, for example, a transistor and/or a diode. According to some example embodiments, one of the first electronic elements ED1 may not include the selection element. For example, one of the first and second ends tm1 and tm2 of the conductive structure CS may be grounded. According to some example embodiments, the first electronic elements ED1 and/or the second electronic elements ED2 may be or may include transistors such as planar NMOS and/or PMOS transistors; however, example embodiments are not limited thereto.

The first current $I_1$ may be an in-plane current. The first current $I_1$ may apply spin-orbit torque to the magnetic tunnel junction structure MTJ that may reverse the magnetization direction of the magnetic pattern FM, adjacent to the conductive line HM, of the magnetic patterns FM and PM. The first current $I_1$ may intersect the magnetic tunnel junction structure MTJ when viewed in a plan view. At this time, the magnetic layer FL may have a magnetization direction substantially perpendicular to the magnetization directions of the magnetic patterns FM and PM and may reduce a value such as a minimum value (e.g., a critical current) of the first current $I_1$ for reversing the magnetization direction of the magnetic pattern FM.

The magnetic tunnel junction structure MTJ may have a resistance in a vertical direction (e.g., a stacking direction of the magnetic patterns FM and PM), which is changeable, for example, which is changeable depending on the magnetization directions of the magnetic patterns FM and PM. The resistance of the magnetic tunnel junction structure MTJ may be detected through the conductive structure CS and the electrode EL. The electrode EL may be connected to a second electronic element ED2 through an interconnection line w. The second electronic element ED2 may include a selection element. For example, the magnetic memory device may have a 3-terminal structure, including terminals connected to first and second ends tm1 and tm2, and a terminal connected to the electrode EL.

More particularly, the conductive line HM may have a first surface s1 and a second surface s2 which are opposite to each other. The magnetic tunnel junction structure MTJ may be provided on the first surface s1 of the conductive line HM, and the magnetic layer FL may be provided on the second surface s2. For example, the conductive line HM may be disposed between the magnetic tunnel junction structure MTJ and the magnetic layer FL. The conductive line HM may include a material capable of preventing or reducing an amount of magnetic coupling between the magnetic layer FL and the magnetic patterns FM and PM. The conductive line HM may include a non-magnetic metal and may not include a magnetic metal. The conductive line HM may include at least one of, for example, hafnium (Hf), platinum (Pt), palladium (Pd), copper (Cu), vanadium (V), titanium (Ti), tantalum (Ta), zirconium (Zr), iridium (Ir), rhodium (Rh), ruthenium (Ru), or tungsten (W). According to some example embodiments, the conductive line HM may include one or more of a diamagnetic material, an antiferromagnetic material, or a paramagnetic material.

The conductive line HM may extend in the first direction D1. For example, a length of the conductive line HM in the first direction D1 may be greater than a width of the conductive line HM in a second direction D2. The conductive line HM may have, for example, a bar shape.

The magnetic tunnel junction structure MTJ may include the magnetic patterns FM and PM stacked on the first surface s1 of the conductive line HM, and the barrier pattern BP between the magnetic patterns FM and PM. Hereinafter, the magnetic pattern FM adjacent to the first surface s1 of the conductive line HM may be referred to as a free magnetic pattern FM, and the magnetic pattern PM different from the free magnetic pattern FM may be referred to as a pinned magnetic pattern PM. For example, the magnetic tunnel junction structure MTJ may include the free magnetic pattern FM, the barrier pattern BP and the pinned magnetic pattern PM, which are sequentially stacked on the first surface s1 of the conductive line HM. The pinned magnetic pattern PM may have a magnetization direction fixed, regardless of an external magnetic field and/or an external electric field, in an operating environment of the magnetic memory device. The pinned magnetic pattern PM may have the magnetization direction substantially parallel to a direction (e.g., a third direction D3) perpendicular to the first surface s1 of the conductive line HM. For example, the pinned magnetic pattern PM may have magnetization components substantially parallel to the third direction D3. A vector sum of magnetization components of the pinned magnetic pattern PM may extend or be substantially parallel to the third direction D3.

A magnetization direction of the free magnetic pattern FM may be changeable by an external magnetic field and/or an external electric field. For example, the free magnetic pattern FM may have two stable magnetization directions substantially parallel to the third direction D3. The stable magnetization directions of the free magnetic pattern FM may have a first magnetization direction MD1 and a second magnetization direction MD2 which are opposite to (antiparallel with) each other. The first magnetization direction MD1 may be the same as (or parallel to) the magnetization direction of the pinned magnetic pattern PM. The second magnetization direction MD2 may be antiparallel to the magnetization direction of the pinned magnetic pattern PM. For example, the second magnetization direction MD2 may be opposite to the magnetization direction of the pinned magnetic pattern PM.

An electrical resistance of the magnetic tunnel junction structure MTJ may be controlled by the magnetization direction of the free magnetic pattern FM. More particularly, an electrical resistance of the magnetic tunnel junction structure MTJ when the magnetization directions of the free and pinned magnetic patterns FM and PM are antiparallel to each other may be greater than an electrical resistance of the magnetic tunnel junction structure MTJ when the magnetization directions of the free and pinned magnetic patterns FM and PM are the same as (or parallel to) each other. For example, the electrical resistance of the magnetic tunnel junction structure MTJ when the free magnetic pattern FM has the second magnetization direction MD2 may be greater than the electrical resistance of the magnetic tunnel junction structure MTJ when the free magnetic pattern FM has the first magnetization direction MD1.

The pinned magnetic pattern PM and the free magnetic pattern FM may include an alloy including at least one of iron (Fe), cobalt (Co) or nickel (Ni) and at least one of boron (B), silicon (Si), zirconium (Zr), platinum (Pt), palladium (Pd), copper (Cu) or tungsten (W). According to some example embodiments, each of the pinned magnetic pattern PM and the free magnetic pattern FM may include at least one of a material having a $L1_0$ crystal structure, a material having a hexagonal close packed (HCP) lattice structure, or an amorphous rare earth-transition metal (RE-TM) alloy. For example, each of the pinned magnetic pattern PM and the free magnetic pattern FM may include at least one of materials (e.g., $Fe_{50}Pt_{50}$, $Fe_{50}Pd_{50}$, $Co_{50}Pt_{50}$, $Co_{50}Pd_{50}$, and $Fe_{50}Ni_{50}$) having the $L1_0$ crystal structure. According to some example embodiments, each of the pinned magnetic pattern PM and the free magnetic pattern FM may include a cobalt-platinum (Co—Pt) disordered alloy and/or $Co_3Pt$ ordered alloy, which has the HCP lattice structure and has a platinum (Pt) content of about 10% to about 45%. According to some example embodiments, each of the pinned magnetic pattern PM and the free magnetic pattern FM may include at least one of amorphous rare earth-transition metal (RE-TM) alloys including at least one of iron (Fe), cobalt (Co) or nickel (Ni) and at least one of terbium (Tb), dysprosium (Dy) or gadolinium (Gd) (i.e., a rare earth metal).

The barrier pattern BP may include at least one of magnesium oxide (MgO), titanium oxide (TiO), tantalum oxide (TaO), aluminum oxide (AlO), zirconium oxide (ZrO), magnesium-zinc oxide (MgZnO), magnesium-boron oxide (MgBO), titanium nitride (TiN) or vanadium nitride (VN). Oxygen atoms in the barrier pattern BP may react with metal atoms (e.g., iron atoms) of the pinned magnetic pattern PM and the free magnetic pattern FM to improve perpendicular magnetic anisotropy of the pinned magnetic pattern PM and the free magnetic pattern FM. According to some example embodiments, the barrier pattern BP may further include a polarization enhancement layer for increasing a spin polarization in the pinned magnetic pattern PM and the free magnetic pattern FM and a magnetoresistance ratio. The polarization enhancement layer may include at least one of iron (Fe), an iron (Fe) alloy having a body centered cubic (BCC) lattice structure, a CoFeB-based amorphous alloy, or an alloy having a $L2_1$ crystal structure.

The magnetic layer FL may be provided on the second surface s2 of the conductive line HM. The magnetic layer FL may have the magnetization direction fixed regardless of an external magnetic field or an external electric field in an operating environment of the magnetic memory device. The magnetic layer FL may have or may include or may consist of, for example, a ferromagnetic material.

The magnetic layer FL may have a magnetization direction (hereinafter, a third magnetization direction MD3) parallel to/extending in a fourth direction D4 which is perpendicular to the third direction D3 and intersects the first direction D1 and the second direction D2. For example, the magnetization direction of the magnetic layer FL may be defined by magnetization components constituting magnetization of the magnetic layer FL. The magnetic layer FL may have magnetization components parallel to the fourth direction D4. A vector sum of the magnetization components of the magnetic layer FL may be parallel to/extend in the fourth direction D4. For example, a net magnetization of the magnetic layer FL may be parallel to/extend in the fourth direction D4. According to some example embodiments, a plurality (e.g., 95% or more) of the magnetization components of the magnetic layer FL may be parallel to/extend in the fourth direction D4. The magnetization components of the magnetic layer FL may determine the magnetization direction of the magnetic layer FL as the third magnetization direction MD3 parallel to the fourth direction D4.

The third magnetization direction MD3 may be parallel to/in the plane of the second surface s2 of the conductive line HM. In addition, the third magnetization direction MD3 may intersect but not be perpendicular to an extending direction of the conductive line HM or a flowing direction of the first current $I_1$. The third magnetization direction MD3 may form an angle θ of 15 degrees to 45 degrees with the first direction D1, for example as illustrated in FIG. 2.

The magnetic layer FL may be formed using an epitaxial growth process. The magnetic layer FL may be formed using, for example, a molecular beam epitaxy (MBE) process and/or a metal organic CVD (MOCVD) process. The magnetic layer FL may be formed at a process temperature of, for example, 200 degrees Celsius to 400 degrees Celsius. According to some example embodiments, the magnetic layer FL may be formed by additionally performing a process for controlling the crystal structure and magnetization direction of the magnetic layer FL. For example, the process for forming the magnetic layer FL may further include an annealing process and/or a magnetic field process. The magnetic layer FL may be formed in such a way that the magnetic layer FL's longitudinal direction forms an angle θ of 15 degrees to 45 degrees with the magnetic layer FL's magnetization direction.

A thickness of the magnetic layer FL may be greater than a thickness of the conductive line HM. In some example embodiments, the magnetic layer FL may have a thickness of 2 nm to 8 nm. In some example embodiments, the conductive line HM may have a thickness of 0.1 nm to 7 nm. Since the thickness of the conductive line HM is less than the thickness of the magnetic layer FL, a value such as a minimum value (or a critical value) of the first current $I_1$ for reversing the magnetization direction of the free magnetic pattern FM may be reduced.

The magnetic layer FL may include an alloy including at least one of iron (Fe), cobalt (Co) or nickel (Ni) and at least one of boron (B), silicon (Si), zirconium (Zr), platinum (Pt), palladium (Pd), copper (Cu) or tungsten (W). In some example embodiments, the magnetic layer FL may include at least one of a material having a $L1_0$ crystal structure, a material having a hexagonal close packed (HCP) lattice structure, or an amorphous rare earth-transition metal (RE-TM) alloy. For example, the magnetic layer FL may include at least one of materials (e.g., $Fe_{50}Pt_{50}$, $Fe_{50}Pd_{50}$, $Co_{50}Pt_{50}$, $Co_{50}Pd_{50}$, and $Fe_{50}Ni_{50}$) having the $L1_0$ crystal structure. In some example embodiments, the magnetic layer FL may include a cobalt-platinum (Co—Pt) disordered alloy or $Co_3Pt$ ordered alloy, which has the HCP lattice structure and has a platinum (Pt) content of about 10% to about 45%. In some example embodiments, the magnetic layer FL may include at least one of amorphous rare earth-transition metal (RE-TM) alloys including at least one of iron (Fe), cobalt (Co) or nickel (Ni) and at least one of terbium (Tb), dysprosium (Dy) or gadolinium (Gd) (i.e., a rare earth metal).

According to some example embodiments, the magnetic layer FL may be formed of the same material as the free magnetic pattern FM. For example, when the magnetic layer FL and the free magnetic pattern FM are formed of/include an alloy, a composition of metal elements in the alloy of the magnetic layer FL may be the same as a composition of metal elements in the alloy of the free magnetic pattern FM. For example, the magnetic layer FL and the free magnetic pattern FM may both be or may independently be formed of CoFeB and/or NiFe.

Figure 3B:
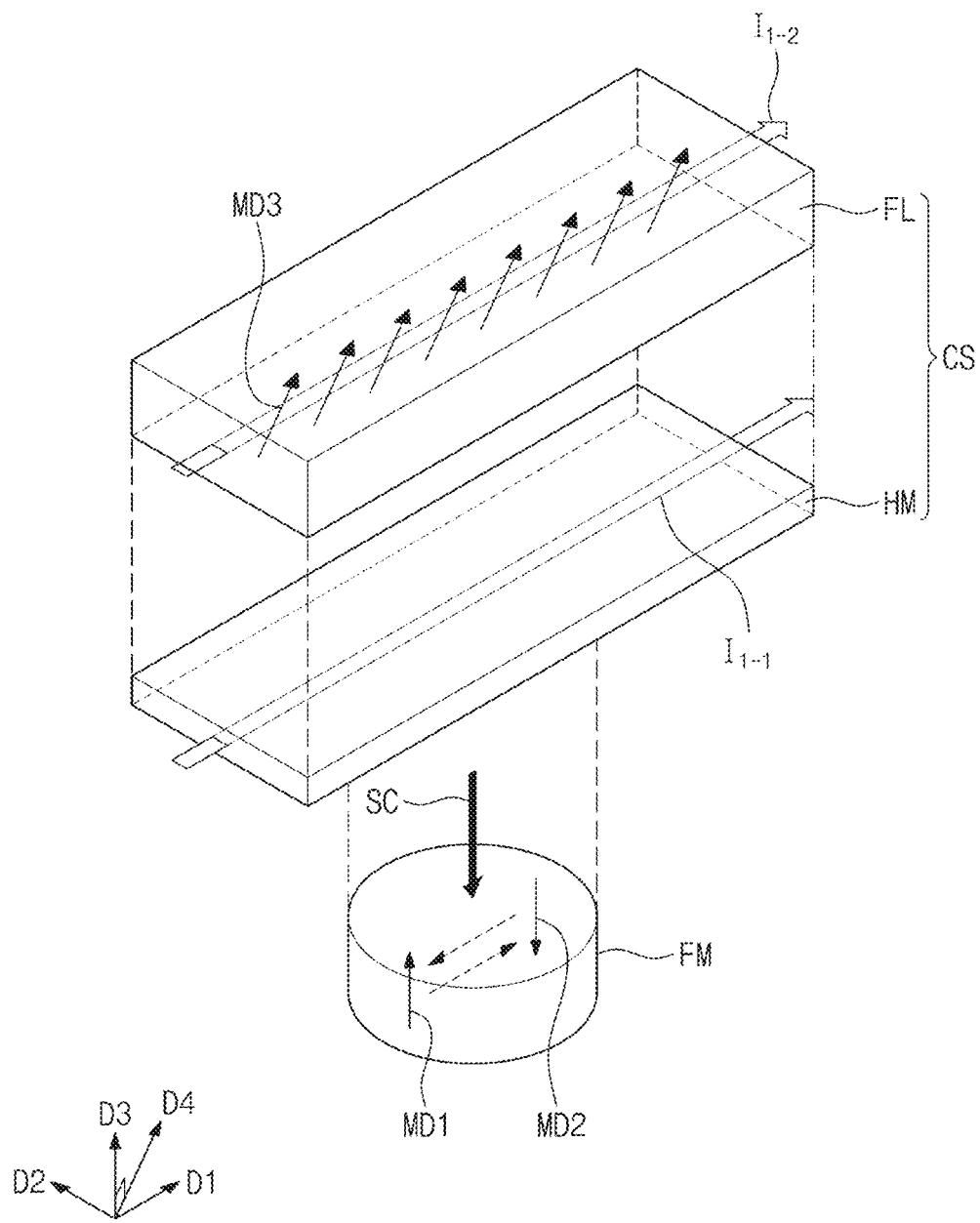
FIG. 3B is an exploded perspective view illustrating a portion of a magnetic memory device according to some example embodiments of inventive concepts.
Figure 3C:
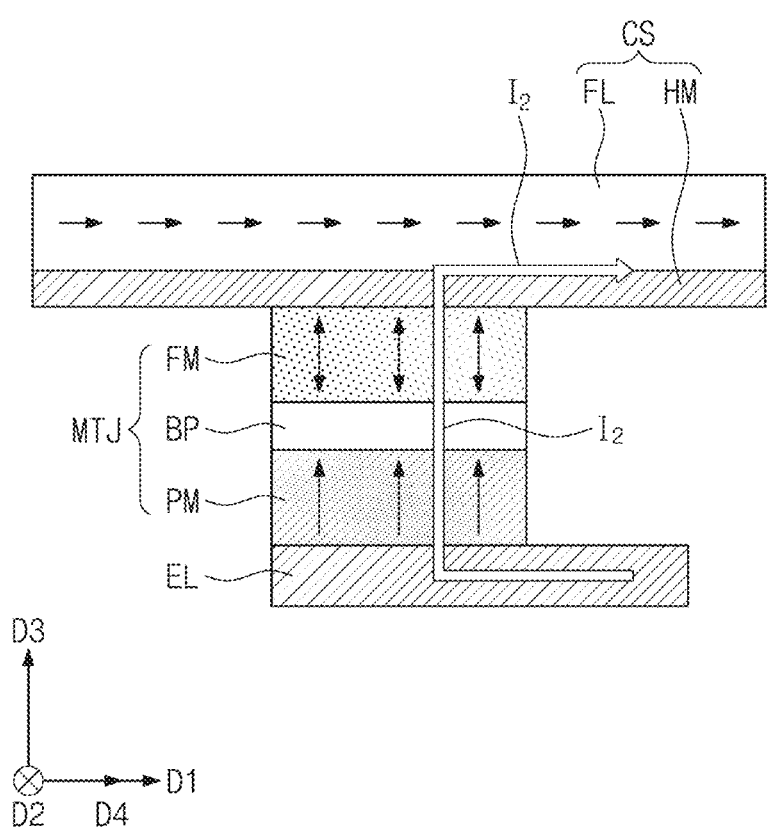

FIGS. 3A and 3C are cross-sectional views illustrating a method of operating a magnetic memory device according to some example embodiments of inventive concepts. FIG. 3B is an exploded perspective view illustrating a portion of a magnetic memory device according to some example embodiments of inventive concepts. Particularly, FIGS. 3A and 3B illustrate a write operation of a magnetic memory device according to some example embodiments of inventive concepts. FIG. 3C illustrates a read operation of a magnetic memory device according to some example embodiments of inventive concepts.

Referring to FIGS. 3A and 3B, a switching voltage may be applied to the both ends tm1 and tm2 of the conductive structure CS by the external element. Thus, the first current $I_1$ may flow in the conductive structure CS. The first current $I_1$ may be an in-plane current and may be parallel to an interface of the conductive structure CS and the magnetic tunnel junction structure MTJ. The first current $I_1$ may generate a spin current SC based on a spin hall effect (e.g., based on a quantum spin hall effect). The spin current SC may flow in a direction substantially perpendicular to the interface of the conductive structure CS and the magnetic tunnel junction structure MTJ and thus may be applied to the free magnetic pattern FM of the magnetic tunnel junction structure MTJ.

The magnetic memory device may have a critical current for reversing the magnetization direction of the free magnetic pattern FM. The critical current may mean or correspond to a value such as a minimum value of a magnitude of the first current $I_1$ for reversing the magnetization direction of the free magnetic pattern FM. When the first current $I_1$ greater than the critical current is applied into the conductive structure CS, the spin current SC may apply spin-orbit torque to the free magnetic pattern FM. The spin-orbit torque may reverse the magnetization direction of the free magnetic pattern FM. For example, when the free magnetic pattern FM has the first magnetization direction MD1, the spin-orbit torque may change the magnetization direction of the free magnetic pattern FM into the second magnetization direction MD2 antiparallel to the magnetization direction of the pinned magnetic pattern PM. In this case, the magnetic tunnel junction structure MTJ may have a high resistance state (i.e., a switch-off state).

In some example embodiments, when a current greater than the critical current is applied to the conductive structure CS in a direction opposite to that of the first current $I_1$, spin-orbit torque in a direction opposite to that of the spin-orbit torque described above may be applied to the free magnetic pattern FM. For example, when the free magnetic pattern FM has the second magnetization direction MD2, the spin-orbit torque generated by the current in the direction opposite to that of the first current $I_1$ may change the magnetization direction of the free magnetic pattern FM into the first magnetization direction MD1 parallel to the magnetization direction of the pinned magnetic pattern PM. In this case, the magnetic tunnel junction structure MTJ may have a low resistance state (e.g., a switch-on state).

In some example embodiments, as illustrated in FIG. 3B, the first current $I_1$ may include a first partial current $I_{1-1}$ flowing in the conductive line HM, and a second partial current $I_{1-2}$ flowing in the magnetic layer FL. Each of the first partial current $I_{1-1}$ and the second partial current $I_{1-2}$ may interact with magnetic spins in the magnetic layer FL to generate the spin current SC. At this time, the second partial current $I_{1-2}$ may generate the spin current SC more effectively than the first partial current $I_{1-1}$. In some example embodiments, the magnetic layer FL may have a resistivity lower than that of the conductive line HM. A current density of the second partial current $I_{1-2}$ may be greater than a current density of the first partial current $I_{1-1}$. Thus, the critical current for changing the magnetization direction of the free magnetic pattern FM may be reduced.

Referring to FIG. 3C, a read voltage may be applied between the conductive structure CS and the electrode EL by the external element. Thus, a second current $I_2$ may flow between the conductive structure CS and the electrode EL. The second current $I_2$ may flow through the inside of the magnetic tunnel junction structure MTJ and may be transmitted to the external element through the conductive structure CS and the electrode EL. The external element may compare a ratio of the read voltage to the second current $I_2$ with predetermined data to determine switch on or off of the magnetic tunnel junction structure MTJ.

Figure 4:
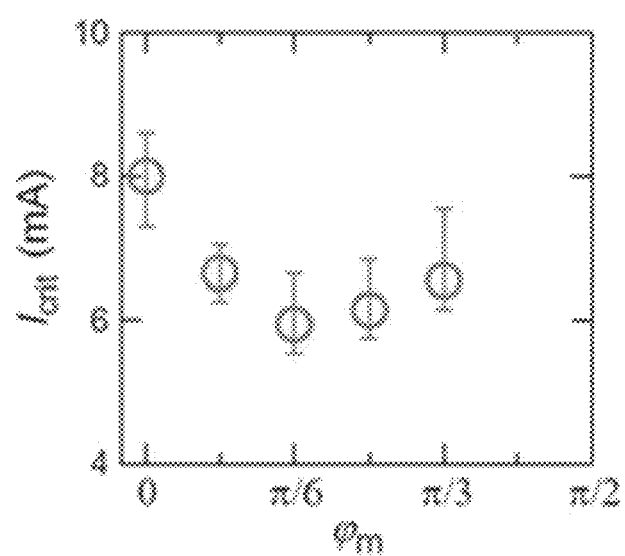
FIG. 4 is a graph showing a change in critical current according to an angle between an in-plane current and a magnetization direction of a ferromagnetic layer.

FIG. 4 is a graph showing a change in critical current according to an angle between an in-plane current and a magnetization direction of a ferromagnetic layer.

EXPERIMENTAL EXAMPLE

Referring again to FIGS. 1 and 2, the conductive structure CS including the magnetic layer FL and the conductive line HM was formed, and then, the magnetic tunnel junction structure MTJ and the electrode EL may be sequentially formed on the conductive structure CS to manufacture the magnetic memory device according to various example embodiments of inventive concepts. The free magnetic pattern FM and the pinned magnetic pattern PM of the magnetic tunnel junction structure MTJ may be formed using Co, CoFeB and NiFe to have interface perpendicular magnetic anisotropy.

The magnetic layer FL may be formed using Co, CoFeB and NiFe to have a magnetization direction perpendicular to the magnetization directions of the free magnetic pattern FM and the pinned magnetic pattern PM. More particularly, the magnetic layer FL may be formed using an epitaxial growth process such as a heterogeneous epitaxial growth process or a homogeneous epitaxial growth process, and process conditions of the magnetic layer FL may be controlled in such a way that the magnetization direction of the magnetic layer FL intersected the direction (e.g. the first direction D1) of the in-plane current flowing in the magnetic layer FL.

A process of measuring a resistance of the magnetic tunnel junction structure MTJ may be repeated while changing a value of the in-plane current applied to the conductive structure CS, thereby measuring the critical current for reversing the magnetization direction of the free magnetic pattern FM.

Magnetic memory devices including the magnetic layers (e.g., ferromagnetic layers) FL having various magnetization directions may be manufactured by controlling process conditions for forming the magnetic layer FL according to the embodiments of inventive concepts. The critical currents according to an angle θ between the direction of the in-plane current and the magnetization direction of the ferromagnetic layer may be measured, and the measured values may be shown in FIG. 4.

Referring to FIGS. 2 and 4, one may recognize that the critical current for reversing the magnetization direction of the free magnetic pattern FM is changed according to the angle θ between the direction of the in-plane current $I_1$ and the magnetization direction MD3 of the magnetic layer FL. As shown in FIG. 4, the critical current may have a value of 7 mA or less when the angle θ has a value of 15 degrees to 45 degrees.

Figure 5:
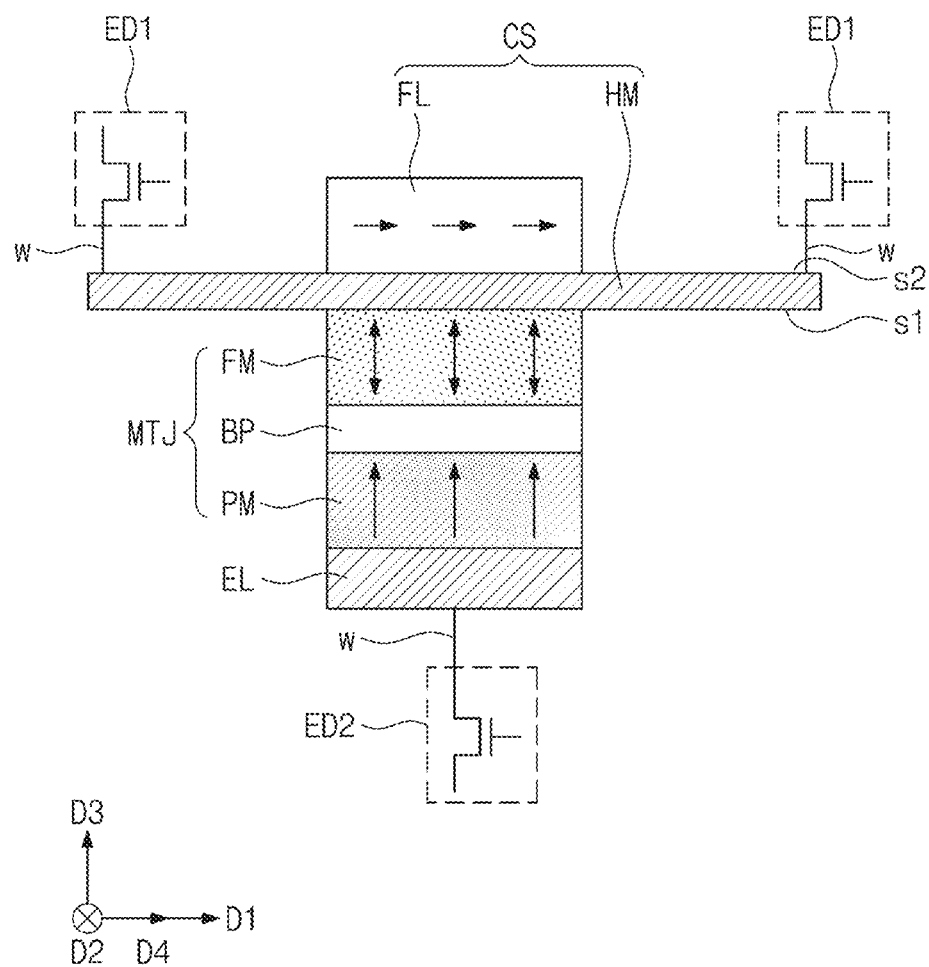
FIG. 5 is a cross-sectional view illustrating a magnetic memory device according to some example embodiments of inventive concepts.

FIG. 5 is a cross-sectional view illustrating a magnetic memory device according to some example embodiments of inventive concepts. Hereinafter, the descriptions to the same/similar components as in the above embodiments will be omitted or mentioned briefly for the purpose of ease and convenience in explanation.

Referring to FIG. 5, the magnetic layer FL may not completely cover the second surface s2 of the conductive line HM. In some example embodiments, the magnetic layer FL may be formed on a portion of the second surface s2 of the conductive line HM and may vertically overlap with the free magnetic pattern FM. The magnetic layer FL may have a magnetization direction substantially perpendicular to the magnetization direction of the pinned magnetic pattern PM and the magnetization direction of the free magnetic pattern FM. The magnetization direction of the magnetic layer FL may be parallel to/may extend in the fourth direction D4 intersecting an extending direction of the conductive line HM. Interconnection lines w connecting the first electronic elements ED1 to the conductive line HM may be connected directly to the second surface s2 of the conductive line HM. An interconnection line w connecting the second electronic element ED2 to the electrode EL may be connected directly to a bottom surface of the electrode EL. The interconnection lines w may include, for example, contact plugs.

Figure 6:
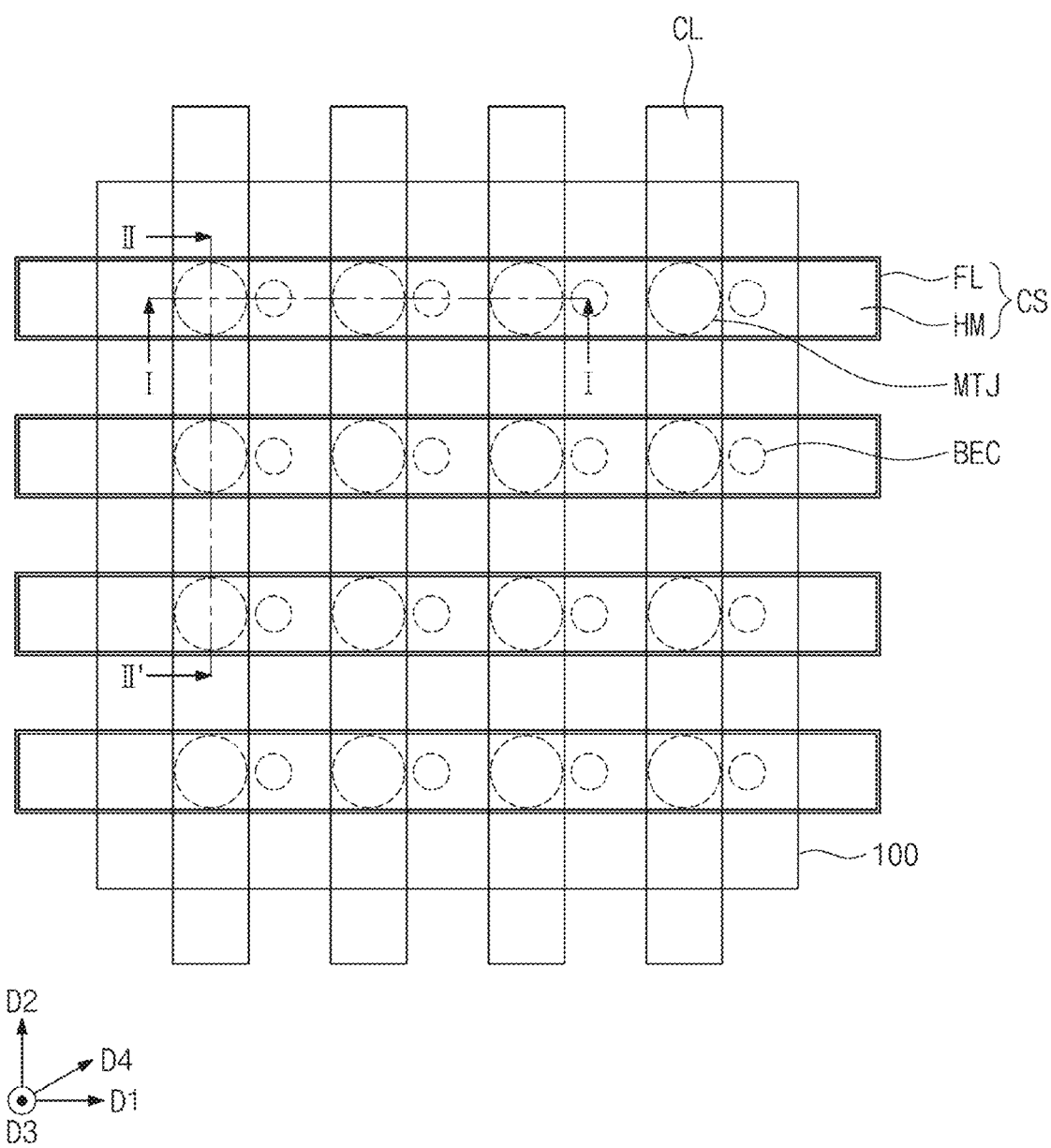
FIG. 6 is a plan view illustrating a magnetic memory device according to some example embodiments of inventive concepts.
Figure 7:
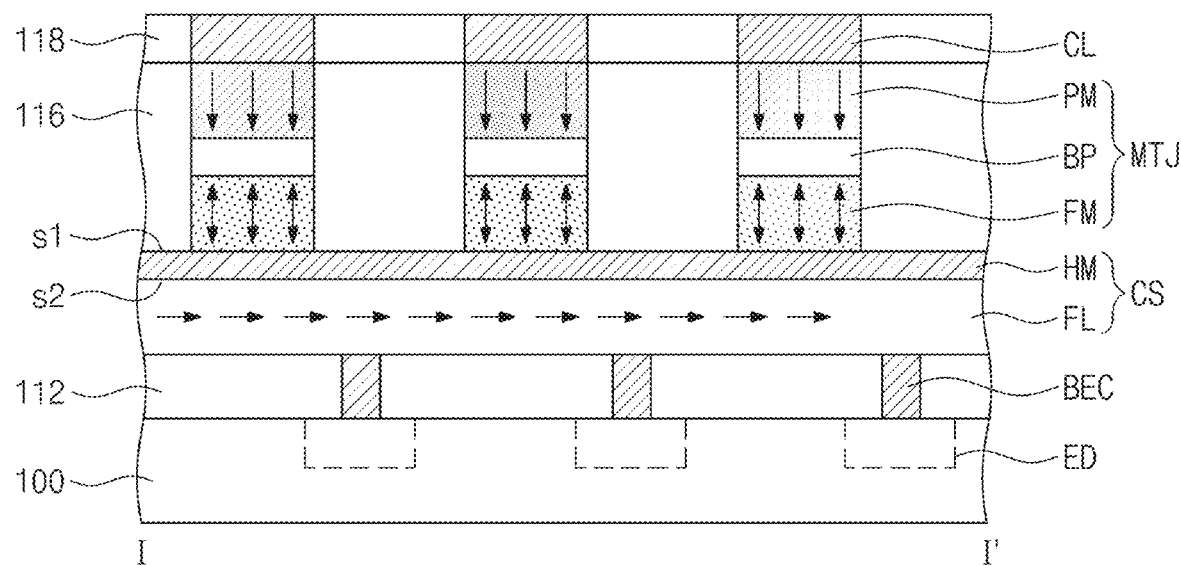
FIGS. 7 and 8 are cross-sectional views taken along lines I-I' and II-II' of FIG. 6, respectively.
Figure 7:
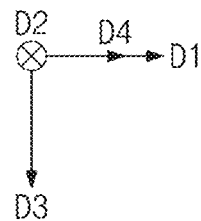
Figure 8:
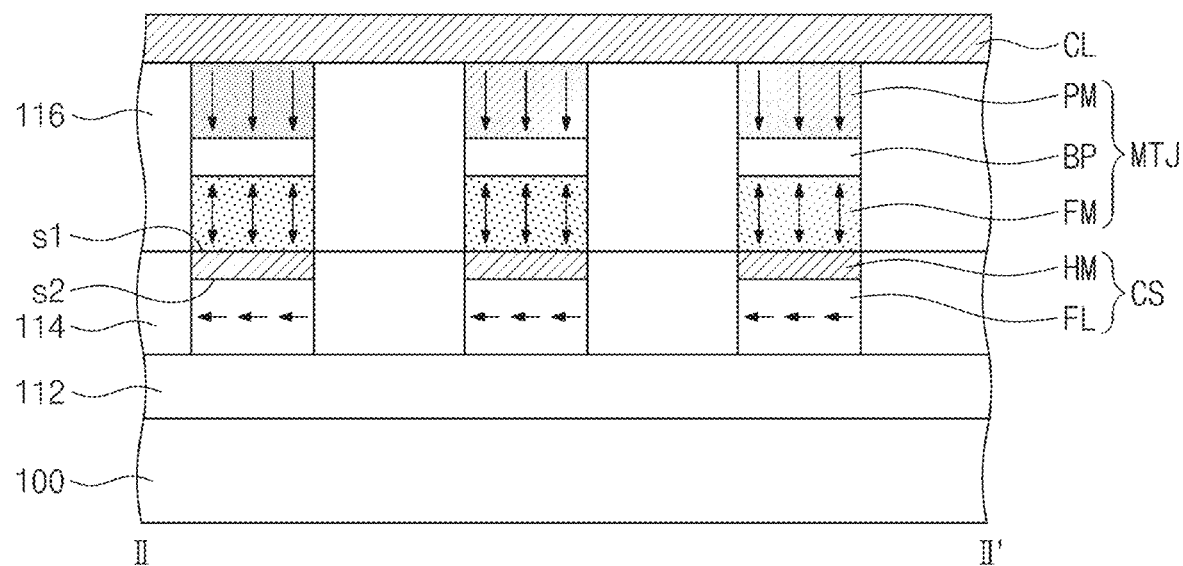
Figure 8:
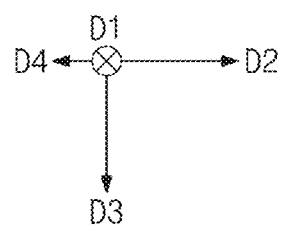

FIG. 6 is a plan view illustrating a magnetic memory device according to some example embodiments of inventive concepts. FIGS. 7 and 8 are cross-sectional views taken along lines I-I' and II-II' of FIG. 6, respectively. Hereinafter, the descriptions to the same/similar components as in the above embodiments will be omitted or mentioned briefly for the purpose of ease and convenience in explanation.

Referring to FIGS. 6 to 8, a magnetic memory device according to some example embodiments of inventive concepts may include a memory cell array including a plurality of unit memory cells. For example, the memory cell array may have a cross point (XP) structure.

Lower contact plugs BEC and a first interlayer insulating layer 112 between the lower contact plugs BEC may be disposed on a substrate 100. The substrate 100 may include a semiconductor substrate and electronic elements ED formed on the semiconductor substrate. The semiconductor substrate may include at least one of silicon (Si), silicon-on-insulator (SOI), silicon-germanium (SiGe), germanium (Ge), or gallium-arsenic (GaAs). Each of the electronic elements ED may include one of the first electronic elements ED1 described with reference to FIG. 1. Each of the electronic elements ED may include a selection element such as a transistor or a diode.

The lower contact plugs BEC may be horizontally spaced apart from each other. For example, the lower contact plugs BEC may be two-dimensionally arranged in a first direction D1 and a second direction D2, which are parallel to a top surface of the substrate 100. Each of the lower contact plugs BEC may be electrically connected to a corresponding one of the electronic elements ED. The lower contact plugs BEC may connect the electronic elements ED to a conductive structure CS. The lower contact plugs BEC may include at least one of a doped semiconductor material (e.g., doped silicon such as doped polysilicon), a metal (e.g., tungsten, titanium, and/or tantalum), a conductive metal nitride (e.g., titanium nitride, tantalum nitride, and/or tungsten nitride), or a metal-semiconductor compound (e.g., a metal silicide). The first interlayer insulating layer 112 may fill a space between the lower contact plugs BEC. The first interlayer insulating layer 112 may include at least one of, for example, an oxide, a nitride, or an oxynitride.

Conductive structures CS and a second interlayer insulating layer 114 may be disposed on the first interlayer insulating layer 112. The conductive structures CS may extend in the first direction D1 and may be spaced apart from each other in the second direction D2. The second interlayer insulating layer 114 may fill spaces between the conductive structures CS. Each of the conductive structures CS may include a conductive line HM and a magnetic layer FL, which extend in the first direction D1 in parallel to each other. The magnetic layer FL may be formed on a second surface s2 of the conductive line HM to completely cover the second surface s2. The magnetic layer FL may have a magnetization direction parallel to a fourth direction D4 which is perpendicular to a third direction D3 and intersects the first direction D1 and the second direction D2. The second interlayer insulating layer 114 may include at least one of, for example, an oxide, a nitride, or an oxynitride.

A plurality of magnetic tunnel junction structures MTJ and a third interlayer insulating layer 116 may be disposed on the second interlayer insulating layer 114. The magnetic tunnel junction structures MTJ may be disposed at intersection points of the conductive structures CS and upper conductive lines CL, respectively. The magnetic layer FL and the conductive line HM may vertically overlap with a plurality of the magnetic tunnel junction structures MTJ arranged in the first direction D1. Each of the upper conductive lines CL may vertically overlap with a plurality of the magnetic tunnel junction structures MTJ arranged in the second direction D2. Each of the plurality of magnetic tunnel junction structures MTJ may connect a corresponding conductive structure CS and a corresponding upper conductive line CL, which intersect each other. Each of the plurality of magnetic tunnel junction structures MTJ may include a free magnetic pattern FM, a barrier pattern BP and a pinned magnetic pattern PM, which are sequentially stacked on a first surface s1 of the conductive line HM. The third interlayer insulating layer 116 may fill a space between the plurality of magnetic tunnel junction structures MTJ. The third interlayer insulating layer 116 may include at least one of, for example, an oxide, a nitride, or an oxynitride.

The upper conductive lines CL and a fourth interlayer insulating layer 118 may be disposed on the third interlayer insulating layer 116. The upper conductive lines CL may extend in the second direction D2 and may be spaced apart from each other in the first direction D1. The fourth interlayer insulating layer 118 may fill spaces between the upper conductive lines CL. The upper conductive line CL may include the electrode EL described with reference to FIG. 1. The upper conductive lines CL may be connected to the plurality of magnetic tunnel junction structures MTJ.

Figure 9:
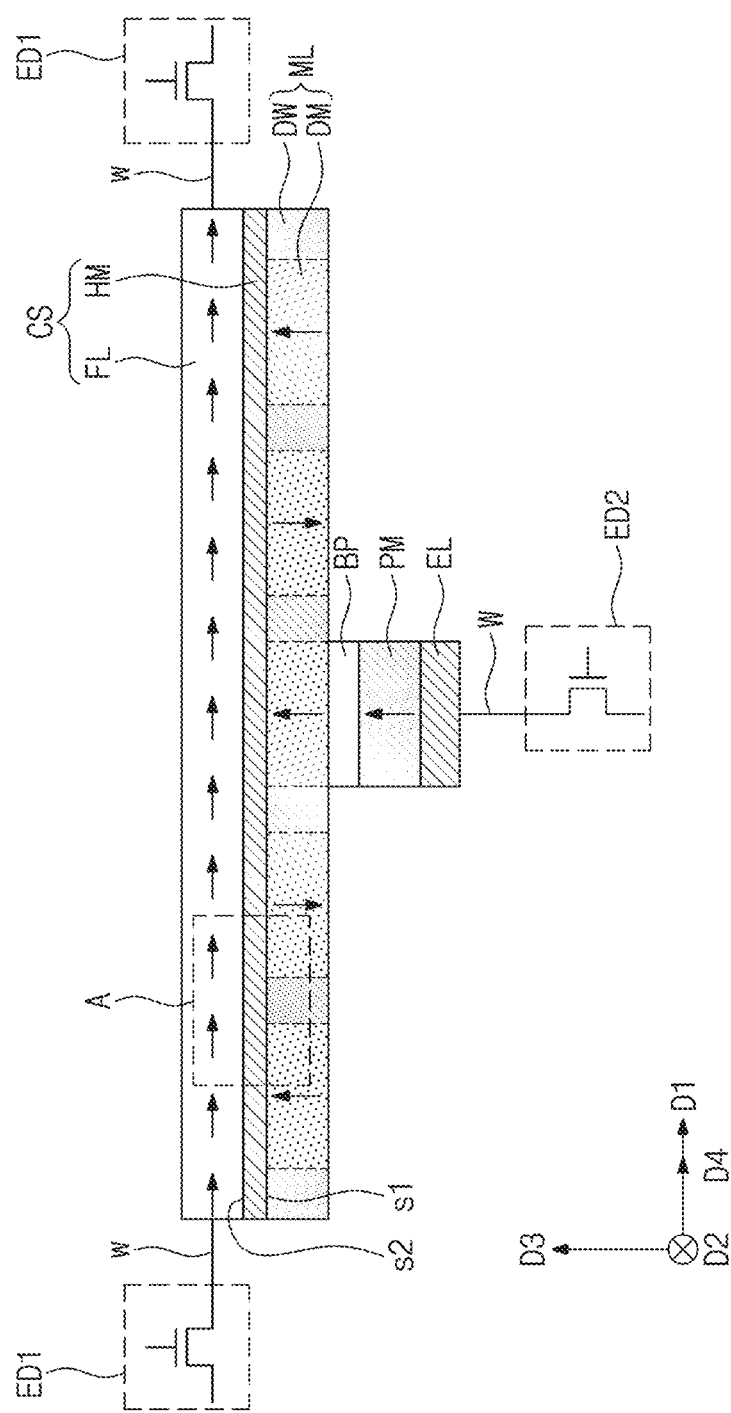
FIG. 9 is a cross-sectional view illustrating a magnetic memory device according to some example embodiments of inventive concepts.
Figure 10:
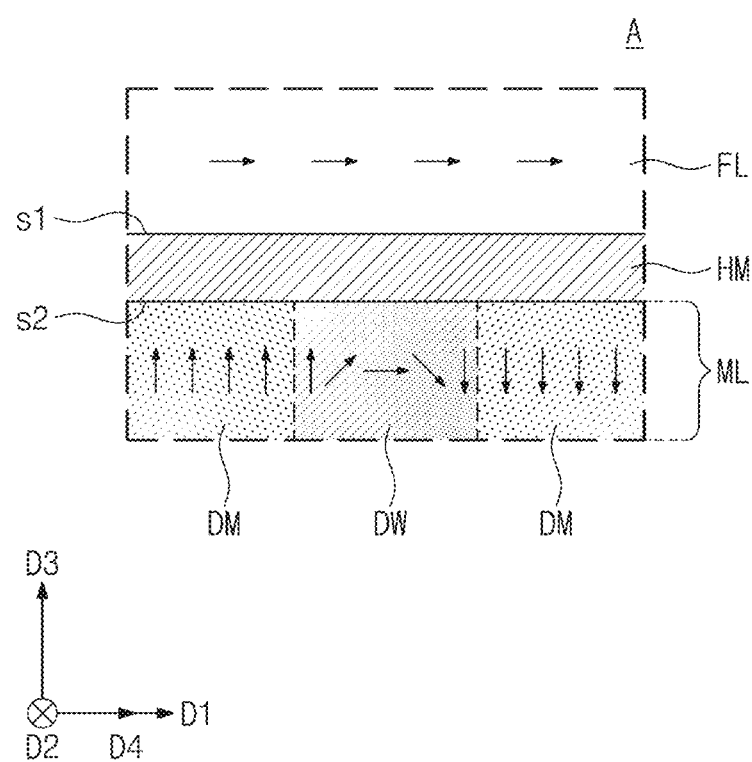
FIG. 10 is an enlarged cross-sectional view of a portion 'A' of FIG. 9.

FIG. 9 is a cross-sectional view illustrating a magnetic memory device according to some example embodiments of inventive concepts. FIG. 10 is an enlarged cross-sectional view of a portion 'A' of FIG. 9. Hereinafter, the descriptions to the same/similar components as in the above embodiments will be omitted or mentioned briefly for the purpose of ease and convenience in explanation.

Referring to FIGS. 9 and 10, a magnetic memory device may include a conductive structure CS, and a free magnetic layer ML, a barrier pattern BP, a pinned magnetic pattern PM and an electrode EL which are sequentially stacked on the conductive structure CS. The conductive structure CS may include the conductive line HM and the magnetic layer FL. According to some example embodiments, the conductive structure CS may have a bar shape extending in the first direction D1. According to some example embodiments, the conductive structure CS may include a portion having a curved shape. For example, the conductive structure CS may include a U-shaped portion.

The free magnetic layer ML may include magnetic domains DM and magnetic domain walls DW between the magnetic domains DM. Each of the magnetic domains DM may be defined as a region in which magnetic moments are aligned in the same direction, and each of the magnetic domain walls DW may be defined as a region in which directions of magnetic moments are changed between the magnetic domains DM. The magnetic domains DM and the magnetic domain walls DW may be formed of substantially the same material. Boundaries (or interfaces) between the magnetic domains DM and the magnetic domain walls DW may not be observed. The free magnetic layer ML may be an elongated magnetic track, and the magnetic memory device according to some example embodiments may be a memory device using movement of the magnetic domain walls DW in the magnetic track. Each of the magnetic domains DM may have perpendicular magnetic anisotropy. In other words, each of the magnetic domains DM may have a magnetization direction parallel to the third direction D3. The free magnetic layer ML may be referred to as a free magnetic pattern. The free magnetic layer ML may extend along the first surface s1 of the conductive line HM, unlike the free magnetic pattern FM described with reference to FIG. 1. For example, the free magnetic layer ML may completely cover the first surface s1 of the conductive line HM.

Both ends of the conductive structure CS may be connected to first electronic elements ED1 through interconnection lines w. For example, the first electronic elements ED1 may include drive transistors for movement of the magnetic domain walls DW. The magnetic domain walls DW may move in the first direction D1 or a direction opposite to the first direction D1 by an in-plane current in the conductive structure CS. More particularly, the in-plane current (equal to or greater than a critical current) applied to the conductive structure CS may generate a spin current based on a spin hall effect (e.g., a quantum spin hall effect) to rotate magnetization directions in the magnetic domains DM and the magnetic domain walls DW. Since the magnetization directions in the magnetic domains DM and the magnetic domain walls DW are changed, positions of the magnetic domains DM and the magnetic domain walls DW may be defined again. For example, the movement of the magnetic domain walls DW may mean or correspond to a change of regions defined as the magnetic domain walls DW, not physical movement of a component.

The magnetic layer FL may be spaced apart from the free magnetic layer ML with the conductive line HM interposed therebetween. The magnetic layer FL may vertically overlap with the magnetic domains DM and the magnetic domain walls DW of the free magnetic layer ML. The magnetization direction of the magnetic layer FL may be parallel to/may extend in the fourth direction D4 intersecting the extending direction of the conductive line HM. The magnetization direction of the magnetic layer FL may be perpendicular/ substantially perpendicular to the magnetization directions of the magnetic domains DM. The magnetic layer FL may reduce the critical current for moving the magnetic domain walls DW to reduce power required for driving the magnetic memory device and to improve a movement speed of the magnetic domain walls DW.

According to various example embodiments of inventive concepts, the magnetic memory device capable of reducing the critical current for changing the magnetization direction of the free magnetic pattern may be provided or realized.

Certain claim terms may be described as having certain numerical values; it is to be understood that the terms may be substantially equal to the claimed numerical values. Alternatively or additionally certain claim terms may be described as having certain geometric shapes and/or positions; it is to be understood that the terms may substantially have the claimed shapes and/or positions. Alternatively or additionally certain claim terms may be described as having certain material compositions; it is to be understood that the terms may substantially have the claimed material composition.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Moreover, when the words "generally" and "substantially" are used in connection with material composition, it is intended that exactitude of the material is not required but that latitude for the material is within the scope of the disclosure.

Further, regardless of whether numerical values or shapes are modified as "about" or "substantially," it will be understood that these values and shapes should be construed as including a manufacturing or operational tolerance (e.g., ±10%) around the stated numerical values or shapes. Thus, while the term "same," "identical," or "equal" is used in description of example embodiments, it should be understood that some imprecisions may exist. Thus, when one element or one numerical value is referred to as being the same as another element or equal to another numerical value, it should be understood that an element or a numerical value is the same as another element or another numerical value within a desired manufacturing or operational tolerance range (e.g., ±10%).

While various example embodiments of inventive concepts have been particularly shown and described, it will be understood by one of ordinary skill in the art that variations in form and detail may be made therein without departing from the spirit and scope of the attached claims. Further example embodiments are not necessarily mutually exclusive. For example, some example embodiments may include one or more features described with reference to one or more figures, and may also include one or more other features described with reference to one or more other figures.

What is claimed is:

1. A magnetic memory device comprising:
   a conductive line extending in a first direction;
   a magnetic tunnel junction structure on a first surface of the conductive line, the magnetic tunnel junction structure comprising at least two magnetic patterns and a barrier pattern between the at least two magnetic patterns; and
   a magnetic layer on a second surface of the conductive line, which is opposite to the first surface,
   wherein the magnetic layer includes magnetization components that have a magnetization in a direction which is parallel to the second surface and intersects the first direction, and
   wherein a length of the conductive line in the first direction is greater than a length of the barrier pattern in the first direction.

2. The magnetic memory device of claim 1, wherein the magnetic layer includes the magnetization components having the magnetization in a direction with an angle of between 15 degrees to 45 degrees with respect to the first direction.

3. The magnetic memory device of claim 1, wherein the conductive line includes a non-magnetic metal.

4. The magnetic memory device of claim 1, wherein the at least two magnetic patterns include a pinned magnetic pattern and a free magnetic pattern between the pinned magnetic pattern and the conductive line, and
   a magnetization direction of the magnetic layer is perpendicular to a magnetization direction of the pinned magnetic pattern.

5. The magnetic memory device of claim 1, wherein the magnetic layer has a fixed magnetization direction.

6. The magnetic memory device of claim 1, wherein the conductive line has a thickness less than that of the magnetic layer.

7. The magnetic memory device of claim 1, wherein the magnetic layer has a resistivity less than that of the conductive line.

8. The magnetic memory device of claim 1, wherein the magnetic layer extends in the first direction along the second surface of the conductive line.

9. The magnetic memory device of claim 1, further comprising
   interconnection lines of which ends are spaced apart from each other in the first direction,
   wherein the magnetic layer connects the ends.

10. The magnetic memory device of claim 1, wherein the at least two magnetic patterns have perpendicular magnetic anisotropy.

11. The magnetic memory device of claim 1, wherein the magnetic tunnel junction structure includes a plurality of magnetic tunnel junction structures on the first surface, and the magnetic layer vertically overlaps with the plurality of magnetic tunnel junction structures.

12. A magnetic memory device comprising:
    a conductive line extending in a first direction, the conductive line having a first surface and a second surface opposite to the first surface;
    a pinned magnetic pattern on the first surface;
    a free magnetic pattern between the conductive line and the pinned magnetic pattern;
    a barrier pattern between the free magnetic pattern and the pinned magnetic pattern; and
    a magnetic layer extending in the first direction on the second surface,
    wherein the magnetic layer has a resistivity less than that of the conductive line, and
    wherein a length of the conductive line in the first direction is greater than a length of the barrier pattern in the first direction.

13. The magnetic memory device of claim 12, wherein a magnetization direction of the magnetic layer is parallel to the second surface and intersects the first direction.

14. The magnetic memory device of claim 13, wherein the magnetization direction of the magnetic layer has an angle of between 15 degrees to 45 degrees with respect to the first direction.

15. The magnetic memory device of claim 12, wherein the pinned magnetic pattern and the free magnetic pattern have perpendicular magnetic anisotropy.

16. The magnetic memory device of claim 12, wherein the conductive line includes a non-magnetic metal.

17. A magnetic memory device comprising:
    a conductive line extending in a first direction;
    a plurality of magnetic tunnel junction structures arranged in the first direction on a first surface of the conductive line, wherein each of the plurality of magnetic tunnel junction structures comprises at least two magnetic patterns and a barrier pattern between the at least two magnetic patterns; and
    a magnetic layer on a second surface of the conductive line, which is opposite to the first surface,
    wherein the magnetic layer vertically overlaps with the plurality of magnetic tunnel junction structures,
    wherein a length of the conductive line in the first direction is greater than a length of the barrier pattern in the first direction.

18. The magnetic memory device of claim 17, further comprising,
    upper conductive lines intersecting the conductive line,
    wherein each of the plurality of magnetic tunnel junction structures is at an intersection point of the conductive line and a corresponding one of the upper conductive lines.

19. The magnetic memory device of claim 17, wherein a magnetization direction of the magnetic layer is parallel to the second surface and intersects the first direction.

20. The magnetic memory device of claim 19, wherein the magnetization direction of the magnetic layer has an angle of between 15 degrees to 45 degrees with respect to the first direction.

* * * * *